(12) United States Patent
Prior et al.

(10) Patent No.: US 6,570,155 B1
(45) Date of Patent: May 27, 2003

(54) BI-DIRECTIONAL ELECTRON BEAM SCANNING APPARATUS

(75) Inventors: Richard Prior, Union City, CA (US); Frank Abboud, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/547,002

(22) Filed: Apr. 11, 2000

(51) Int. Cl.$^7$ ................................................ G03F 9/00
(52) U.S. Cl. ............ 250/311; 250/396 R; 250/396 ML; 250/492.2; 250/398
(58) Field of Search ............................. 250/311, 208.3, 250/398, 492.2, 396 ML, 396 R

(56) References Cited

U.S. PATENT DOCUMENTS

| | | | |
|---|---|---|---|
| 4,445,039 A | | 4/1984 | Yew |
| 5,719,402 A | | 2/1998 | Satoh et al. |
| 6,331,711 B1 | * | 12/2000 | Vernon ..................... 250/492.2 |
| 6,262,429 B1 | * | 7/2001 | Rishton et al. ......... 250/492.23 |

FOREIGN PATENT DOCUMENTS

JP         2000138157       5/2000

* cited by examiner

*Primary Examiner*—Bruce Anderson
*Assistant Examiner*—Zia R. Hashmi
(74) *Attorney, Agent, or Firm*—Jung-hua Kuo

(57) ABSTRACT

The present invention relates to bi-directional raster scanning ("serpentine scanning") for an electron beam lithography system. Improved circuit components are described for generating the true triangular waveform required in bi-directional scanning. The circuitry of the present invention provides control of signal amplitude, frequency and phase to better than 1 ppm by making use of signal generation circuitry described pursuant to the present invention. A series of coarse and fine tuning delay adjustments pursuant to the present invention accommodate a variety of operating conditions. Another embodiment of the present invention relates to an optimization of the data path hardware for bi-directional scanning, including isolating a section of the data path hardware specifically to provide calibration scans. The delay circuit built into the data preparation hardware helps compensate for delays caused by finite bandwidth in the analogue drivers. A two-level beam deflection is described in which fast, low-voltage electrostatic deflectors are employed (preferably one for each scan direction) in conjunction with a slower magnetic beam deflector. The two level deflection system pursuant to the present invention allows for controlling the retroscan signal to match the polarity of the main magnetic deflection signal.

5 Claims, 15 Drawing Sheets

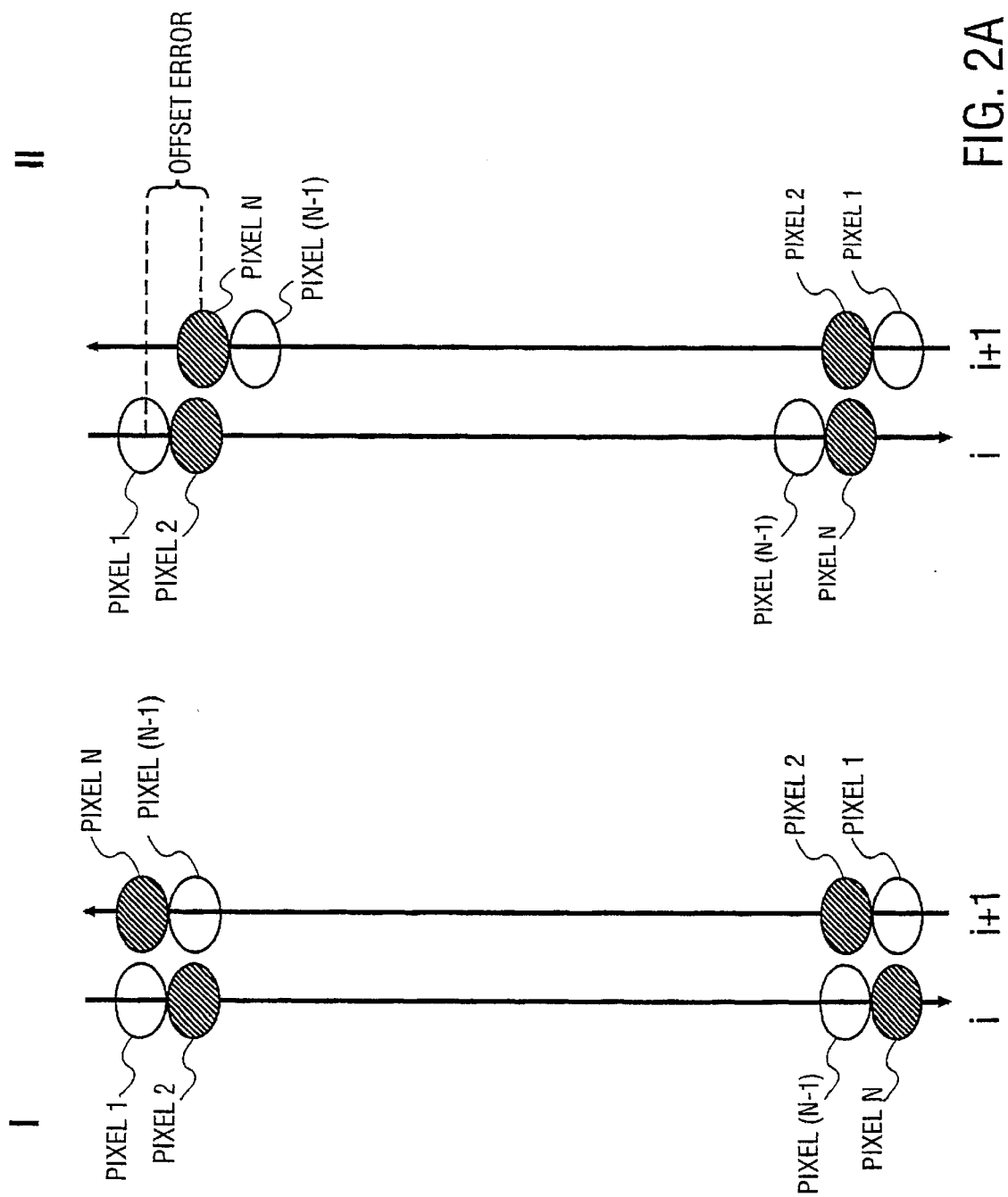

"START NEW SCAN" SYNCHRONIZES THE BEGINNING OF EACH SCAN.

"SCAN DIRECTION" (ORIGINATES IN BEAM DEFLECTION CONTROL SIGNAL GENERATOR) PROVIDES INFORMATION TO OTHER MODULES IF THE DEFLECTION IS SCANNING UP OR DOWN.

BI-DIRECTIONAL ELECTRON BEAM SCANNING APPARATUS

BACKGROUND OF THE INVENTION

1. Technical Field

The present invention relates to the lithographic writing of patterns on substrates by means of directed energy beams, typically electron beams. More particularly, the present invention relates to increasing the throughput of beam lithography by utilizing bi-directional scanning of the beam over the substrate including correction of the beam scanning characteristics in both scan directions to achieve high accuracy in the patterns being written.

2. Description of Related Art

The fabrication of integrated circuits ("ICs") requires ever more accurate methods for creating patterns on a wafer substrate. Two basic processes are commonly used. In one process, the pattern may be created on a resist-coated wafer by exposing the wafer to a beam of energy directed onto the substrate through a mask containing the desired pattern. "Positive resists" require transparent regions of the mask for those areas in which resist removal is desired. "Negative resists" require opaque regions of the mask for those areas in which resist removal is desired. Both positive and negative resists are commercially useful. Exposure through a mask is typically performed with electromagnetic radiation although exposure by means of electron, ion or particle beams impinging on the mask are not excluded. "Photolithography" denotes the exposure of a resist-coated substrate through a patterned mask, typically by means of electromagnetic radiation.

The second method of writing patterns on a resist makes use of a beam of energy directed only to those regions of the resist-coated surface requiring exposure without screening by an intervening mask. A suitable beam steering mechanism is typically employed along with suitable on-off controls to insure that only the regions of the surface requiring exposure are contacted by the incident beam. The beam may be electrons, ions, neutral particles or collimated laser light or other electromagnetic radiation. However, to be definite in our discussion, we will emphasize the example of a beam of electrons impacting the resist-coated substrate (e-beam lithography), not excluding thereby other forms lithography by means of directed energy beams.

Direct beam writing of patterns onto a resist-coated surface is the method presently preferred for creating the masks used in photolithography, but the technique offers other advantages as well. Among these other advantages of direct beam writing are the avoidance of complications of alignment and registration of the mask with the substrate and the possibility of creating more precise patterns with the use of accurately focused beams. One disadvantage of direct beam patterning in comparison with photolithography is the relatively smaller throughput possible with direct beam writing. Increasing the throughput of direct beam writing is one objective of the present invention.

Considering e-beam lithography by way of example and not limitation, the presently employed writing techniques may be classified into one of two general categories, vector scan or raster scan. Vector scan typically directs the beam while off to a region of the substrate requiring exposure, then by turning the beam on exposes a contiguous region of the substrate to the energy of the beam before moving to another region for exposure. Simply stated, vector scanning "paints" or "tiles" a region of the substrate with beam energy before moving on to expose another region. Most conveniently, beam direction, scanning trajectories, pixel spot size and/or intensity are under computer control, defining the pattern to be written.

Raster scanning directs the beam to all regions of the substrate no matter what pattern requires exposure and adjusts the beam intensity at each point scanned to effect the correct pattern of exposure. The simplest beam control during raster scanning entails having the beam on or off as each pixel is scanned. However, adjustment of beam intensity to numerous levels between full-on and full-off (gray scales) is also feasible in some raster scanning procedures. For example, see the work of Abboud et. al. U.S. Pat. No. 5,393,987.

One common type of raster scanning is unidirectional, denoting the scanning geometry of writing an entire line from beginning to end followed by beam-off "flyback" to begin writing the next line adjacent to the first pixel of the just-completed line, as depicted schematically in FIG. 1-I. Bi-directional scanning denotes the writing of a line in one direction (say bottom to top) then writing the immediately adjacent line in the opposite direction (top to bottom) in which the first pixel of the second line is adjacent to the last pixel of the first line, as depicted schematically in FIG. 1-II. The non-productive "flyback" period is typically much shorter when bi-directional scanning is used than when writing by means of the uni-directional scanning of Figure 1-I.

Usage in the art may use "raster scan" as a generic term to distinguish "vector scan" including within the concept of raster scanning both uni-directional and bi-directional scanning. Unfortunately, "raster scan" may also be used to indicate just uni-directional scanning as in FIG. 1-I in contrast to "serpentine scanning" of FIG. 1-II. Hereinafter, we will use "raster scan" to distinguish vector scan to indicate that every pixel in the scan pattern has the beam directed in its direction with the beam off for pixels not written, including therein both unidirectional and bi-directional scanning of FIG. 1. To be definite in expression, FIG. 1-I we denote as "unidirectional" while FIG. 1-II we denote as either "bi-directional" or "serpentine."

"Writing a line" is used herein to distinguish from "flyback," even though few or none of the pixels in a particular line "written" actually receive any beam energy. That is, "writing a line" denotes scanning the beam over a line of pixels on the substrate under a condition that, depending on the particular pattern, may or may not receive beam energy striking pixels in the line. In contrast, "flyback" denotes the act of repositioning the beam following completion of the writing of a particular line in preparation for writing the next line of the pattern. During flyback, the beam is off. That is, the beam is typically directed to a blanking plate, beam dump, or in some other fashion caused not to impact onto the substrate although an actual energy beam may be generated in the writing system. Genuine termination of the beam at its source is also possible for the "beam-of" condition. Thus, the beam is typically fully off during flyback but, during writing, impacts each pixel in the line or pattern being written with the appropriate amount of energy (which may be zero).

Writing precise patterns on the substrate requires (among other things) precise control of the beam path during writing and precise positioning of the beam during flyback to insure correct placement of lines on the substrate. Beam deflection signals typically include both electronic and electron optic effects to direct the beam in the desired writing-pattern. However, such beam deflection signals are typically not linear to the required degree of accuracy, leading to imprecise patterns. One way to achieve high accuracy in e-beam writing and positioning is to measure the beam distortion in a calibration step and apply beam correction signals ("dynamic corrections") during actual writing. Prior work of the present inventor related to uni-directional scanning, U.S. Pat. No. 5,345,085 ("'085") describes methods and systems for determining the dynamic corrections during a calibration step, storing correction signals in a table look-up arrangement then applying the proper correction signals to the main beam deflection signal as the pattern is being written. Increased pattern accuracy results.

However, since the flyback time for unidirectional scanning is typically larger than the flyback time for bi-directional scanning, throughput of e-beam patterning systems may be increased if bi-directional scanning is employed. The work of Yew (U.S. Pat. No. 4,445,039) is one approach to bi-directional scanning in which savings in flyback time translates into increased system throughput.

Several challenges must be met in generalizing the beam correction techniques of the '085 patent to bi-directional scanning, particularly when beam accuracy around one part-per-million (1 ppm) is required. For example, the scan distortions for the positive scan direction (upward, line 2c, in FIG. 1-II) are typically significantly different from those in the negative scan direction (line 2d in FIG. 1-II). This is illustrated in FIG. 1A in which a dynamic correction signal, 200c for scan 2c is qualitatively and quantitatively different from the dynamic correction, 200d, that needs to be applied to the opposite-running scan line, 2d. The depictions of FIG. 1A are schematic and illustrative only, as the dynamic correction signals (200c, 200d) typically represent voltages applied to the beam deflection means to correct for inherent imperfections in the beam deflection circuitry, while the scan lines are depicted in a two-dimensional spatial plane. Since the dynamic correction signal correlates with the location of the beam along its scan line, it is convenient to depict both on a single figure as in FIG. 1A, notwithstanding the combining of distance and voltage units of measure.

This asymmetry in scanning properties seems to derive chiefly from electronic effects, such as the positive and negative directional scanning making use of drive circuits that are not precisely symmetrical in reversing directions. At a minimum, the table of corrections doubles in size as independent corrections for reversed scan directions need to be included.

Other effects leading to beam distortions include eddy current or skin effect distortions of the signals applied to deflection coil(s), phase delay asymmetries in positive and negative scans, position shift in the last pixel of one scan line and the first pixel of the immediately following scan line, and others. Each distortion typically has its own cause and each must be categorized independently to insure that the proper correction is applied to the deflection signal in both positive and negative scan directions.

Additional complexities are introduced into the system timing when bi-directional scanning is employed. One objective in writing patterns is to properly align the pixels of one scan line with the corresponding pixels of the immediately adjacent scan line. Typically, accuracy better than 5 ppm is desirable in this line-to-line alignment of individual pixels. The timing of individual system signals may have a substantial effect on the positioning accuracy of individual pixels, including (but not limited to) timing and control of the deflection signal, beam blanking control (beam-on, -off), dynamic correction signals and error correction signals compensating for mechanical motions of the substrate being written (typically a mechanical stage holding the substrate to be patterned).

A portion of a bi-directional scan is depicted in FIG. 2 in which 7 denotes a sequence of individual pixels, solid circles indicating written pixels and open circles indicating unwritten pixels. We depict writing as either "on" or "off" merely for convenience and not to indicate that the present invention excludes intermediate levels of pixel exposure between full on and full off. FIG. 2A depicts two lines of writing side-by-side and both starting and ending pixels. The left depiction, 2A(I) indicates perfect alignment while the right depiction, FIG. 2A(II) indicates possible pixel shift from the last position of one scan line to the first pixel of the next scan line. That is, row i, pixel N misaligns with row (i+1), pixel 1. This is a challenge that must be met in an accurate bi-directional scanning apparatus.

Also, the finite bandwidth of typical beam deflection circuits can introduce substantial errors in phase delay timing as depicted in FIG. 2B. The bandwidth, $f_c$, of a typical low pass filter causes a phase delay in the output signal. The delay in FIG. 2B is $[1/(2\pi f_c)]$ for a triangular input signal. The offset error depicted in FIG. 2B is the product of the delay and the signal slope. Typical values for $f_c$ may be approximately 500 KHz. Typical signal slope may be approximately (1000 $\mu$m )/(25 $\mu$sec), yielding an offset error of 12.7 $\mu$m. This offset error, depicted in FIG. 2A, has a detrimental effect on pixel alignment.

A typical application for e-beam patterning is in the creation of photolithography masks for the fabrication of integrated circuits. Such masks typically require numerous identical patterns to be produced at various locations on the mask and interconnected in various ways. It is common for the mask designer to write computer commands for mask creation hierarchically; that is, constructing the desired patterns out of sub-patterns, sub-sub-patterns and the like down to the level of the most elementary pattern written on the substrate by the beam. This hierarchy of function calls must be translated into pixel-by-pixel beam control instructions at the time of writing. Translational of the hierarchical instruction file into the pixel-by-pixel "flat file" is typically done as needed during beam writing as the flat file typically contains excessive data (perhaps $10^{12}$ to $10^{15}$ bytes) that cannot feasibly be created and stored prior to patterning. Thus, the need for real-time data preparation is a complicating factor in generalizing accurate beam writing technologies to bi-directional scanning.

In many beam lithography applications, precise control of both the frequency and amplitude of beam deflection/scanning signals is required. For complex beam lithography systems, timing must be synchronized between the various modules that manage the scanning operations and data preparation. Bi-directional scanning introduces serious complications into many of these steps.

The present invention relates to a bi-directional lithography system, including the generation and application of beam correction signals to achieve higher throughput without sacrificing patterning accuracy.

BRIEF SUMMARY OF THE INVENTION

The present invention relates to bi-directional raster scanning ("serpentine scanning") for an electron beam lithography system. Bi-directional scanning requires true triangular waveforms, typically more difficult to generate accurately than sawtooth waveforms typical of unidirectional scanning. Improved circuit components are described as well as improved data preparation and handling for optimized control of bi-directional scanning.

The circuitry of the present invention provides control of signal amplitude, frequency and phase to better than 1 ppm by making use of signal generation circuitry described in detail herein. A feature of the signal generation circuitry is to provide accurate synchronization of deflection to provide accurate control of pixel location. Improper selection and routing of timing signals can lead to harmful levels of noise and unacceptable signal jitter, the avoidance of which is an important objective of the present invention. A series of coarse and fine tuning delay adjustments pursuant to the present invention accommodate a variety of operating conditions.

Another class of improvements in connection with the present invention relates to an optimization of the data path hardware for bi-directional scanning, including isolating a section of the data path hardware specifically to provide calibration scans. The sawtooth waveform for unidirectional scanning is replaced with a triangular waveform for bi-directional scanning by means of, in one embodiment, using a first-in-first-out ("FIFO") register in the data preparation hardware. Such hardware is provided to provide the data direction control determining the direction of the particular scan line as well as phase control or data delay circuit for shifting the entire scan line by up to several hundred pixels). The delay circuit built into the data preparation hardware helps compensate for delays caused by finite bandwidth in the analogue drivers.

In addition, a two-level beam deflection is described in which fast, low-voltage electrostatic deflectors are employed (preferably one for each scan direction) in conjunction with a slower magnetic beam deflector. The two level deflection system pursuant to the present invention allows for controlling the retroscan signal to match the polarity of the main magnetic deflection signal.

BRIEF DESCRIPTION OF THE DRAWINGS

The drawings herein are not to scale.

FIG. 2A: Schematic depiction of pixel writing. (I) depicts perfect alignment and (II) depicts misalignment.

DETAILED DESCRIPTION OF THE INVENTION

In the following description and figures, similar reference numbers are used to identify similar elements.

Figure 1:
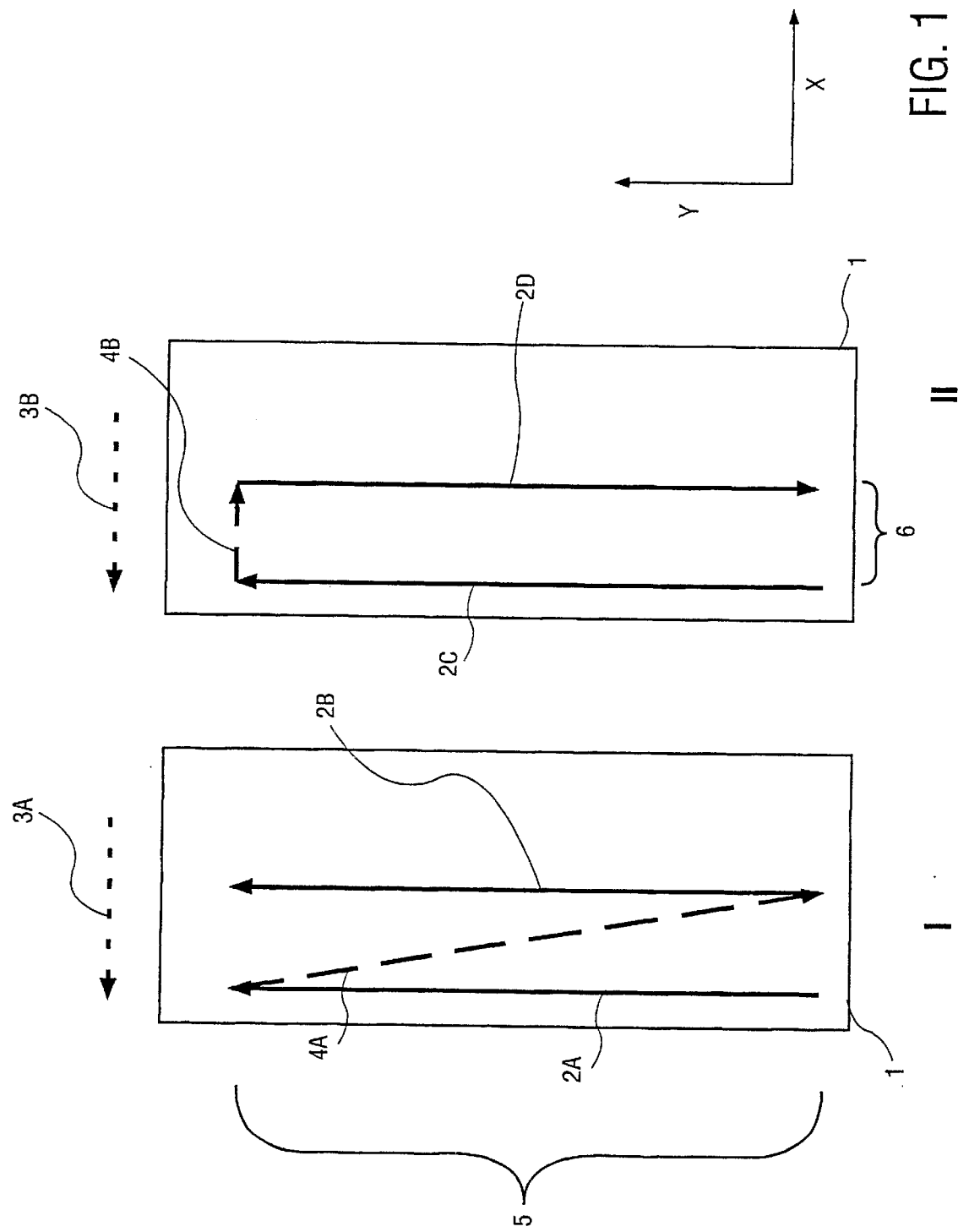
FIG. 1-I, 1-II: Schematic depiction of uni-directional scanning (1-I), and bi-directional scanning (1-II) in which the solid arrows 2a, 2b, 2c, 2d indicate that the line is being written by the incident beam and dotted arrows 4a, 4b indicate flyback.
Figure 1A:
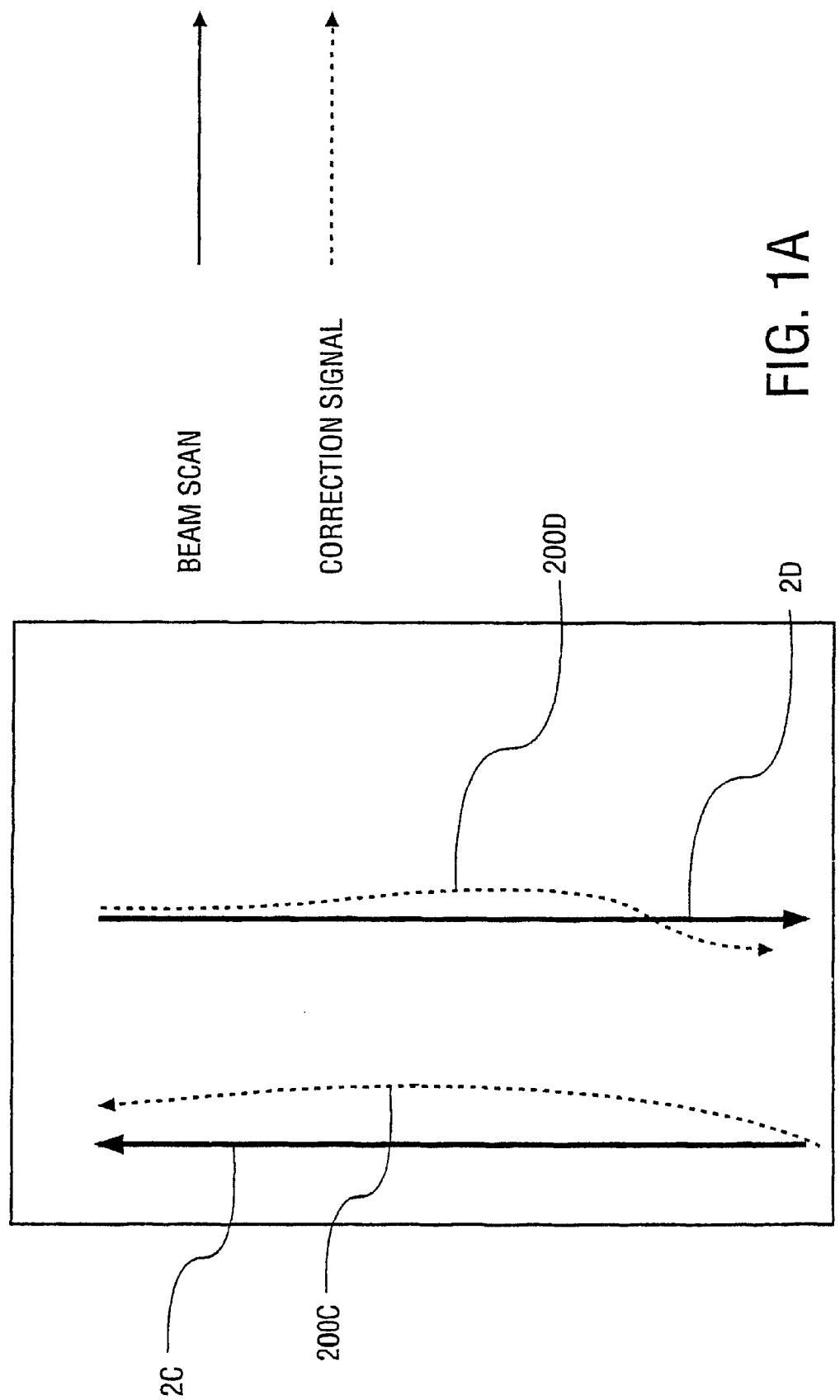
FIG. 1A: Schematic and illustrative depiction of varying dynamic corrections that need to be applied in the up and down scan directions.

FIG. 1 depicts schematically (and not to scale) uni-directional scanning in FIG. 1-I and bi-directional scanning in FIG. 1-II. Actual writing of a pattern typically occurs by one mode or the other, depicted side-by-side for comparison. Typically, the substrate to be patterned is mounted on a mechanical stage capable of translation in the plane of the substrate, x,y in FIG. 1. The substrate is mechanically translated to position the portion of the substrate to be written in the target zone of the beam, typically under the electron writing beam. This target zone is depicted as 1 in FIG. 1. Typically, an accuracy of about +20 $\mu$m (micrometers or microns =$10^{-6}$ meters) is achieved by this mechanical positioning step, although +2 $\mu$m accuracy may be achieved in some systems. Actual writing of region 1 occurs by writing numerous lines ($2_a$, $-2_d$ . . . etc.). Written lines may be approximately 1000 $\mu$m (1 mm) in length, denoted as 5. Spacing between adjacent lines, 6, is typically around 50–100 nm (50 nanometers 0.050 $\mu$m). During writing, the substrate typically undergoes translational motion in a direction perpendicular to the direction of writing, denoted as 3a or 3b. Stage translational speeds of the mechanical stage, 3a, 3b, may be typically around 3 mm/sec. Thus, the full range of motion of the wafer involves both x,y mechanical translations during the writing of a region, 1, and to position the substrate for writing different regions (although only x mechanical translation is depicted as 3a, 3b in FIG. 1).

A typical e-beam lithography system writes lines 2 having a length from approximately 250 $\mu$m to approximately 1000 $\mu$m depending on the particular pattern being written. For purposes of illustration and not limitation, we will consider the case of writing one or more lines, 2, having a length of approximately 1000 $\mu$m. It is desired that accuracy in positioning and linearity in writing lines 2 be about 1 ppm; that is a deviation of not significantly more than 0.001 $\mu$m (1 nm) in writing a line approximately 1000 $\mu$m in length. For purposes of illustration, a typical e-beam lithography system might require about 25.6 $\mu$s (microseconds) to write line 2 and about 6.4 $\mu$m for uni-directional flyback, 4a. Thus, uni-directional scan, FIG. 1-I takes typically approximately 32 $\mu$s to write a line and to reposition the beam to be ready to write the next line. Bi-directional scanning depicted in FIG. 1-II likewise requires about 25.6 $\mu$s to write a line but only approximately 2 $\mu$s for flyback, 4b. Thus, bi-directional scanning as in FIG. 1-II saves approximately 4.4 $\mu$s or about 14% of the total 32 $\mu$s writing and flyback time. Time savings of this magnitude should translate into a comparable increase in product throughput. An increase in throughput exceeding 10% is significant in the commercial use of e-beam lithography.

Figure 2:
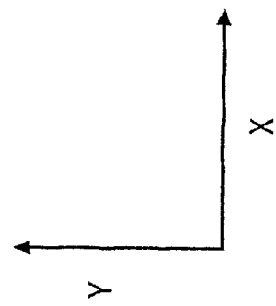
FIG. 2: Schematic depiction of pixel writing, assuming for purposes of illustration, not limitation, that open circles (○) denote unwritten pixels and solid circles (●) denote written pixels.
Figure 2:
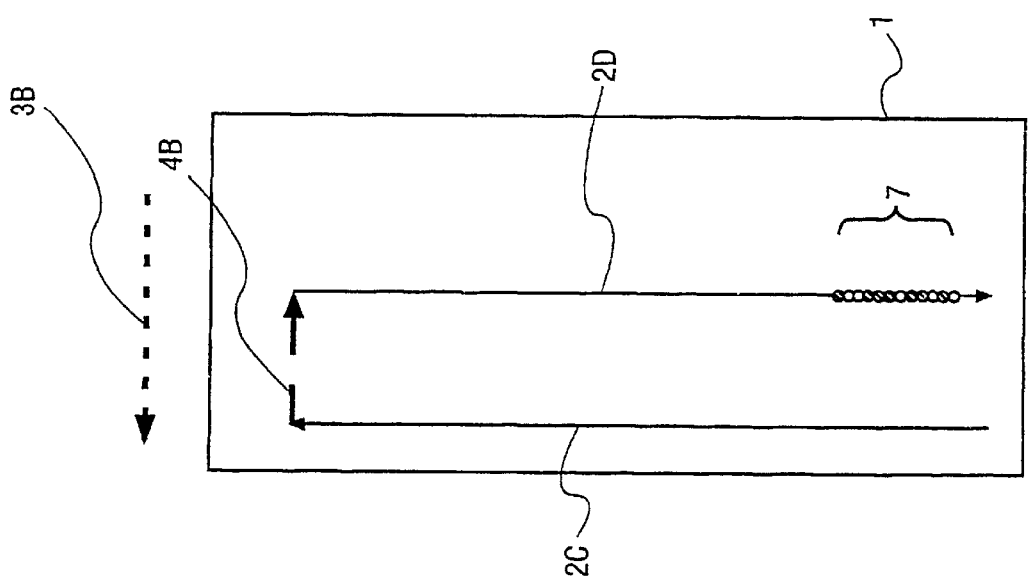
Figure 2B:
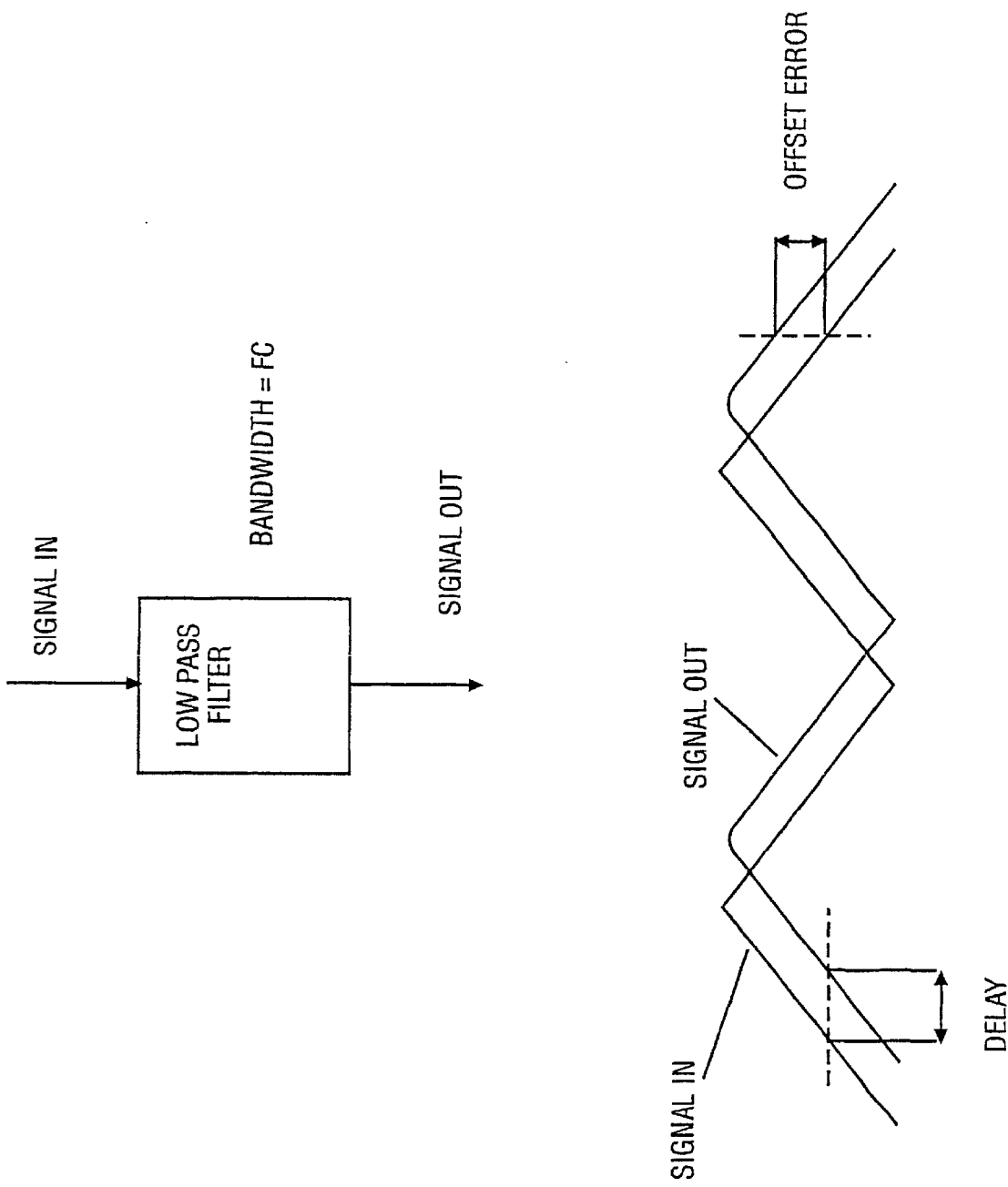
FIG. 2B: Schematic depiction of relationship between bandwidth $f_c$, phase delay and offset error for triangular waveform.

FIG. 2 depicts the bi-directional writing of FIG. 1-II including as 7 a segment of pixels written (solid circles ●) or not (open circles ○) along line 2d. This depiction is schematic only as the full line 2d will be entirely written with pixels and pixels may have numerous levels of gray rather than the simple writing (solid) or no writing (open) depicted in FIG. 2. In typical modem e-beam lithography equipment, the writing of pixels will be by means of e-beam modulation of approximately 320 MHz. These numerical values are intended to be typical and not to prescribe the limits or limitations of the present invention.

Replacing unidirectional scanning with bi-directional scanning introduces two broad classes of challenges. The first set of challenges relates to the circuit components and hardware used for conventional uni-directional raster scanning and problems encountered in attempting to improve the circuit to handle bi-directional serpentine scanning. The second set of challenges relates to the data preparation and handling in controlling the scanning hardware. As mentioned above, user data is typically supplied in a hierarchical format that must be rendered into system-controlling flat format as needed by the e-beam controlling circuits. Significant complications arise in data preparation and in the data paths that must be employed when attempting to generalize from uni-directional to bi-directional scanning.

Figure 3:
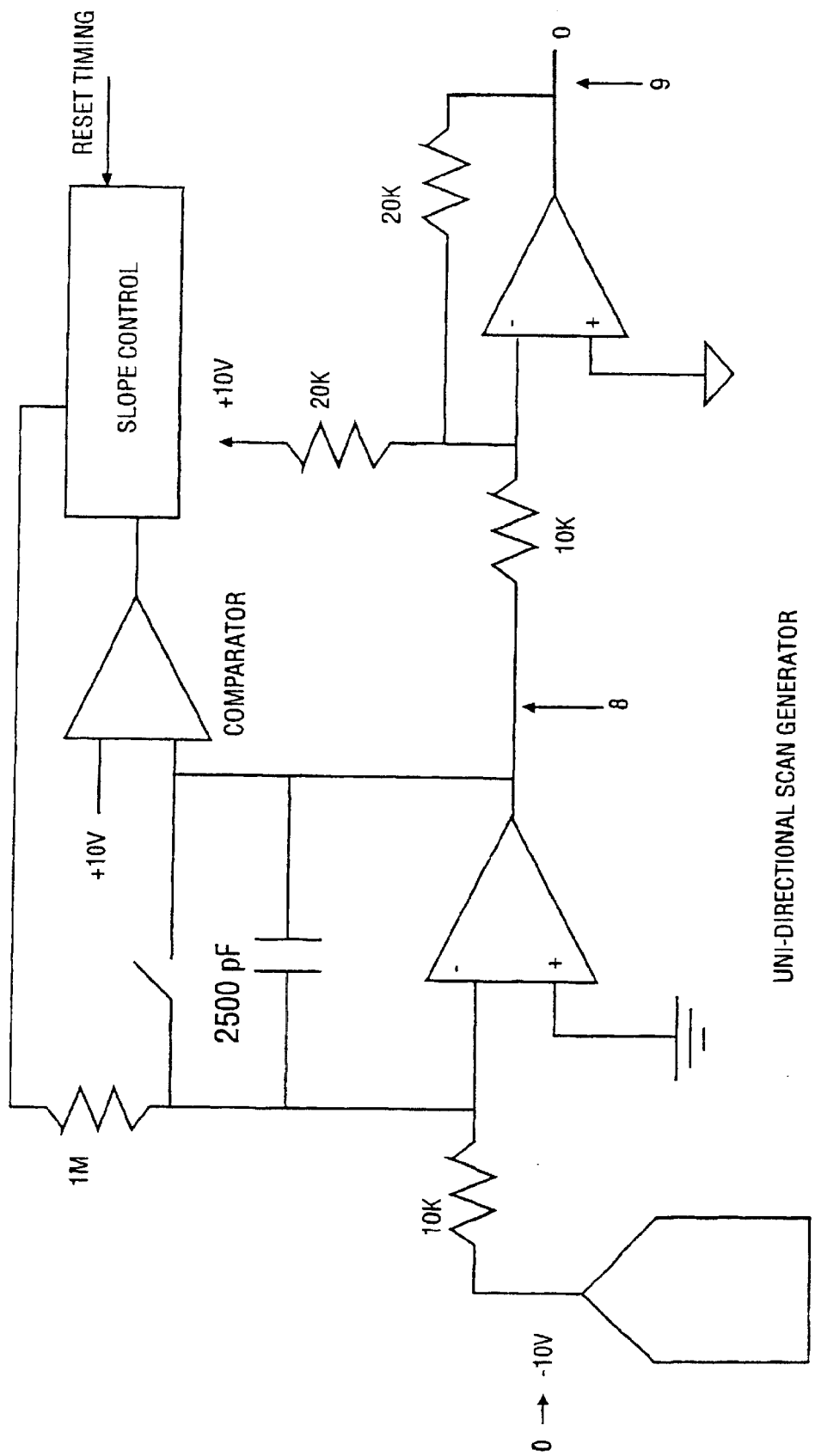
FIG. 3: Schematic block diagram of typical uni-directional scan generating circuit.
Figure 4:
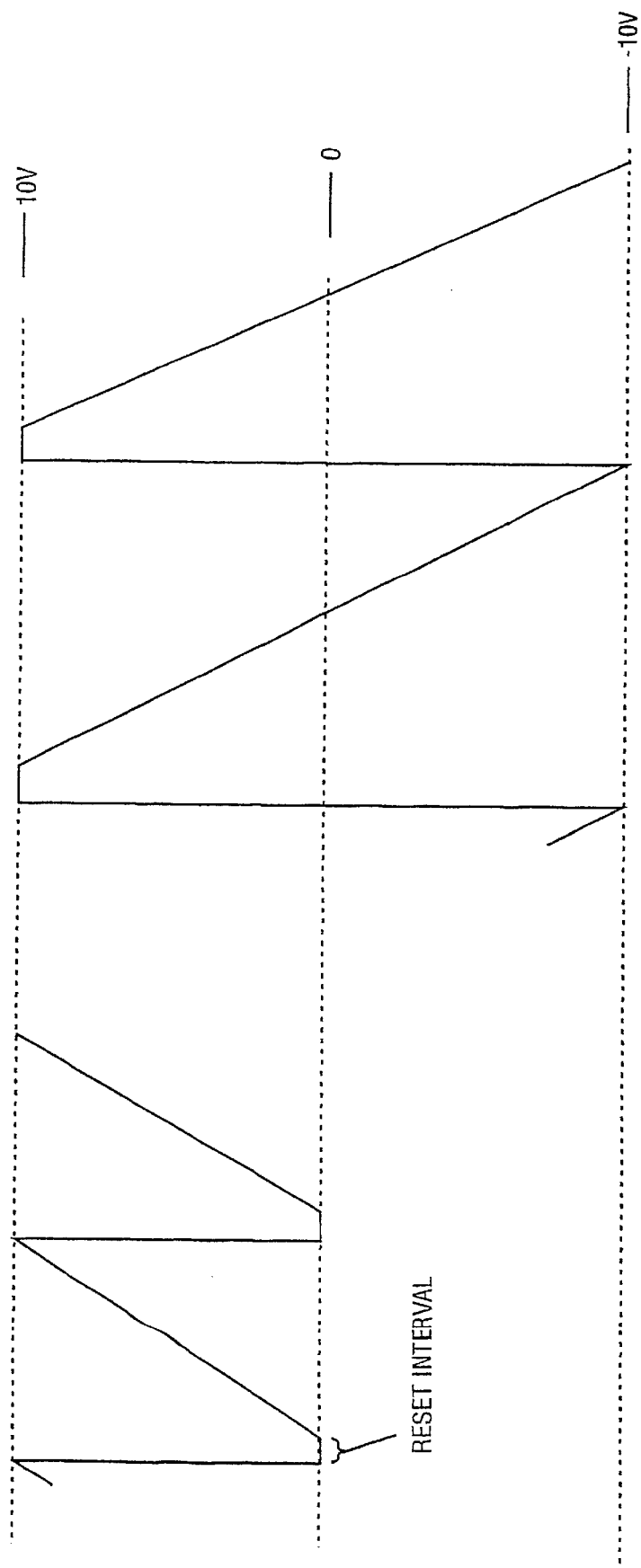
FIG. 4: Typical waveforms generated for uni-directional scanning. circuit of FIG. 3.

Treating first the hardware improvements for bi-directional scanning, FIG. 3 depicts a schematic circuit diagram of a typical signal generator for producing the control signals for the uni-directional scanning of FIG. 1-I. FIG. 4 depicts typical voltage waveforms as measured at positions 8 and 9 in FIG. 3 respectively. The numerical values for voltages, resistances, capacitance, etc. are typical values found useful in generating the uni-directional raster scanning signals, not limiting the present invention. The signal is reset to zero, typically by means of some type of switch (commonly analogue). The circuit is then set to "ramp mode" generating the scanning deflection signal by opening the switch and summing by means of a suitable integrating circuit. Such procedures provide a substantially linear ramp signal during the scanning portion of the signal and a stable zero-point reference at the start of the scan. The end point of the scan is typically measured by means of a comparator sampling technique, synchronized with the scan timing signals.

The uni-directional scanning signals generated by the circuitry of FIG. 3 (and having waveforms depicted in FIG. 4) are subject to comparator noise. In addition, substantial support circuitry is typically required at the comparator output (9 in FIG. 3) to translate the peak detector signal into a useful slope-control signal. The '085 patent cited above provides a method for eliminating the need for comparator methods of peak detection.

Figure 3A:
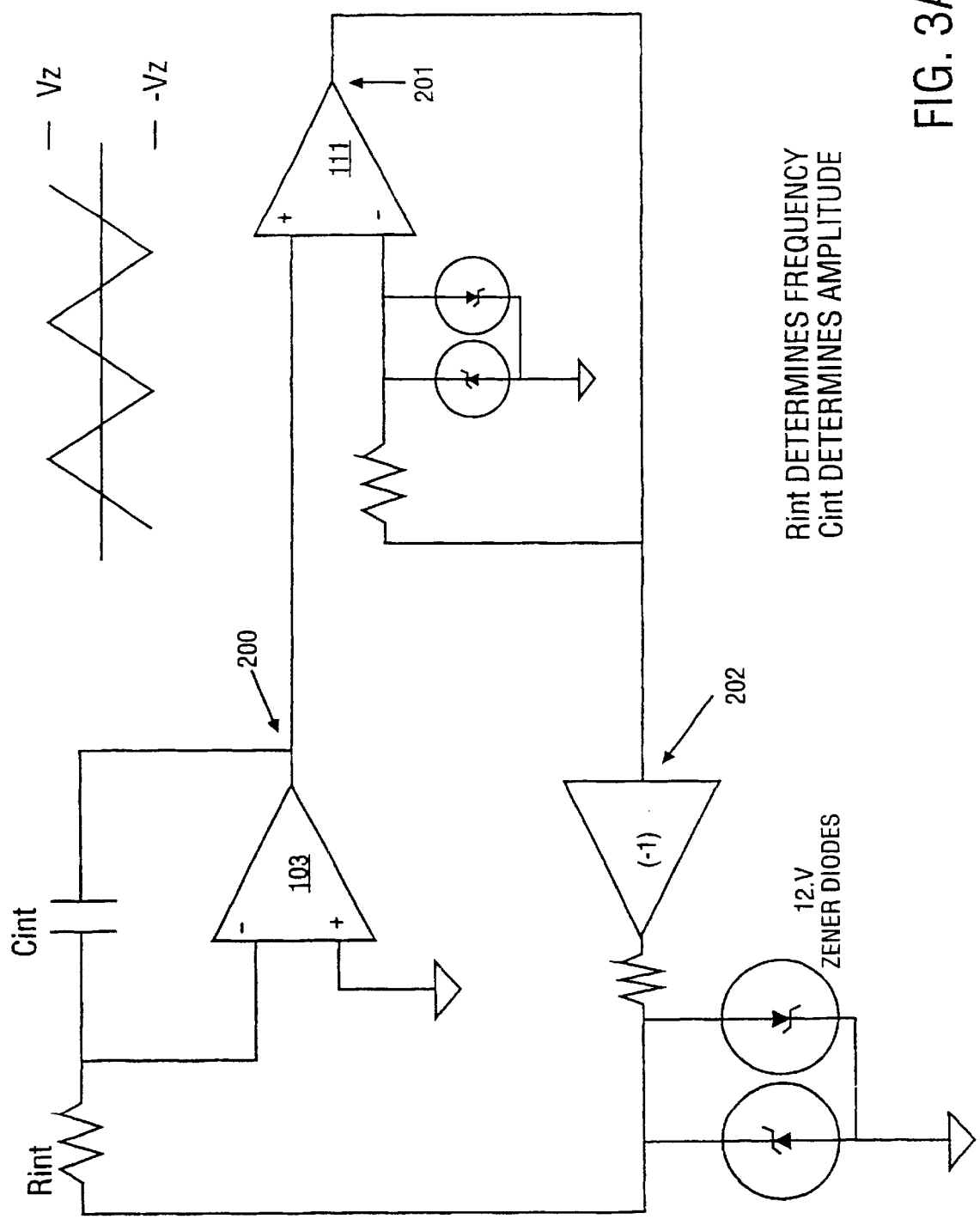
FIG. 3A: Schematic block diagram of bi-directional scan generating circuit.
Figure 3B:
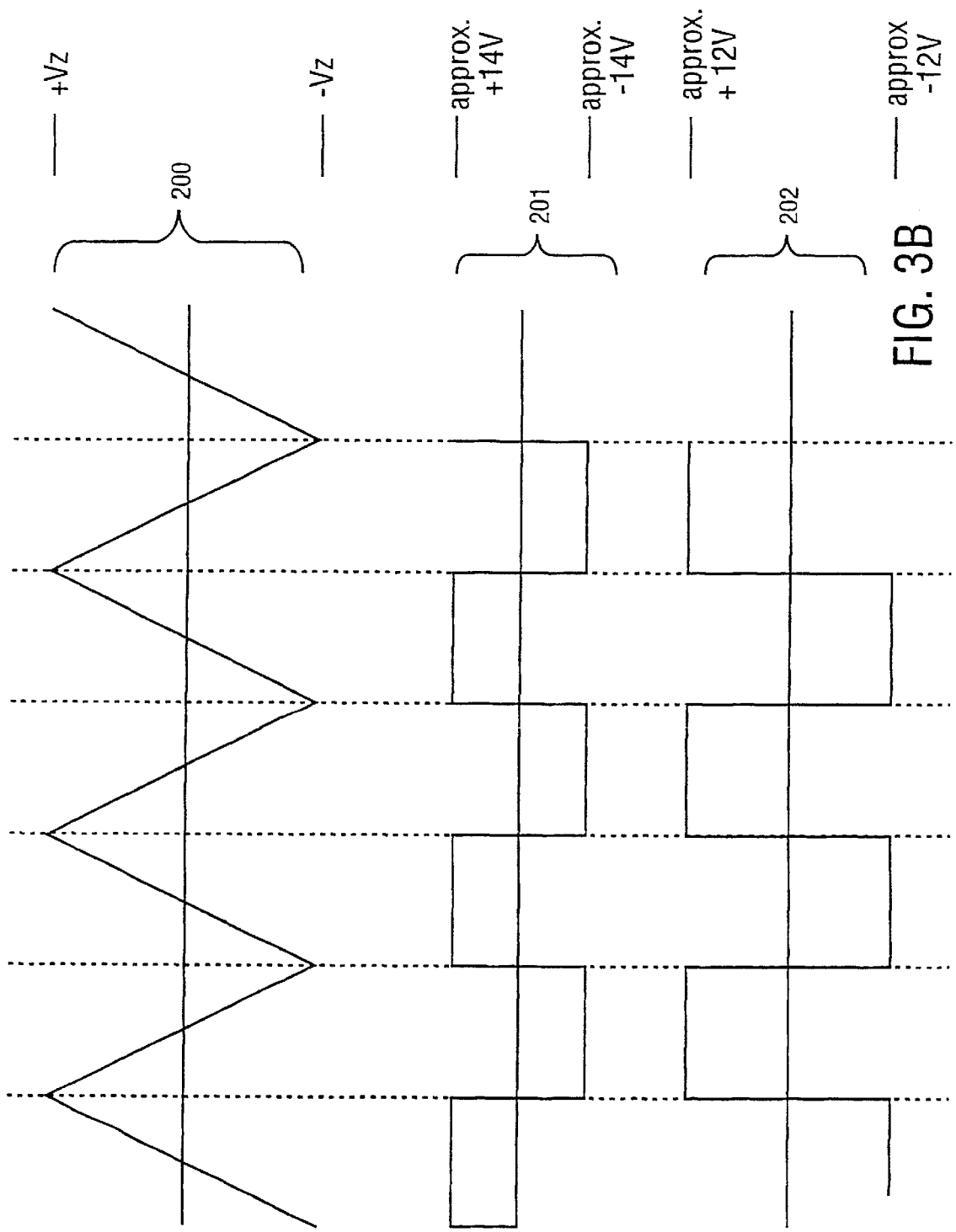
FIG. 3B: Waveforms generated by circuit of FIG. 3A.

However, the large signal change required during unidirectional flyback, 4a, is a significant source of inaccuracy that may be improved by use of bi-directional scanning. to Bi-directional scanning requires true triangular waveforms (in contrast to the sawtooth waveforms of unidirectional scanning) and are typically much more complex to generate. A typical bi-directional control circuit as depicted in FIG. 3A makes use of comparators, zener diodes, etc. to set switching levels and resistors to set integrating current. This type of circuit making use of these types of components have several limitations that effectively preclude its full use in a bi-directional scanning lithography system. For example, the scan length, 5, is typically adjustable from approximately 250 $\mu$m to approximately 1,000 $\mu$m depending on the particular pattern being written. This necessitates that the amplitude of the output voltage waveform vary from approximately ±2.5 volts to approximately ±10 volts, typically by means of a coarse software adjustment. Following such amplitude adjustment, the scanning signal must remain stable to approximately 1 ppm for a duration of several minutes, during which time the e-beam lithography is performed. To achieve the full system requirements required of modem e-beam lithography equipment, the zener voltage (or equivalent function) must be software controllable. In addition, the frequency of the circuit must be synchronized to a system clock, minimizing the phase shift between the scan signal generator and the system. Although a simple adjustment of $R_{int}$, perhaps by means of a software adjustment, may be sufficient to adjust frequency, phase locking by this circuit alone is not assured.

Thus, there are three hardware (circuit) challenges that must be met in constructing a bi-directional scan generator: signal amplitude, frequency and phase must all be controlled to approximately 1 ppm. Achieving all three simultaneously in a bi-directional scanning generator circuit is a primary objective of the present invention.

In addition to improvements in the circuitry to permit accurate bi-directional scanning, improvements in data preparation, manipulation and flow are needed for effective bi-directional lithography. Beam lithographic systems typically use hardware to process pattern data from user-supplied files. The data in user-supplied files typically represent specific circuit features such as logic devices, memory cells of RAM (random-accessmemory), etc. as may typically be fabricated on IC's making use of photolithography masks fabricated by beam lithography. The data in user-supplied files, typically organized hierarchically by circuit element, is usually broken down into fragments or patterns more amenable to beam lithography, typically referred to as "stripes" or "swaths." These stripes are further broken down into beam control data for writing individual pixels. The beam control data is finally presented to the beam blanking module (or other device controlling beam intensity) for final control of the beam intensity incident on the resist. Better dose control is achieved by "gray scale" or "gray beam" modulation, although at the cost of considerably more complex hardware (Abboud et. al. U.S. Pat. No. 5,393,987).

Figure 5A:
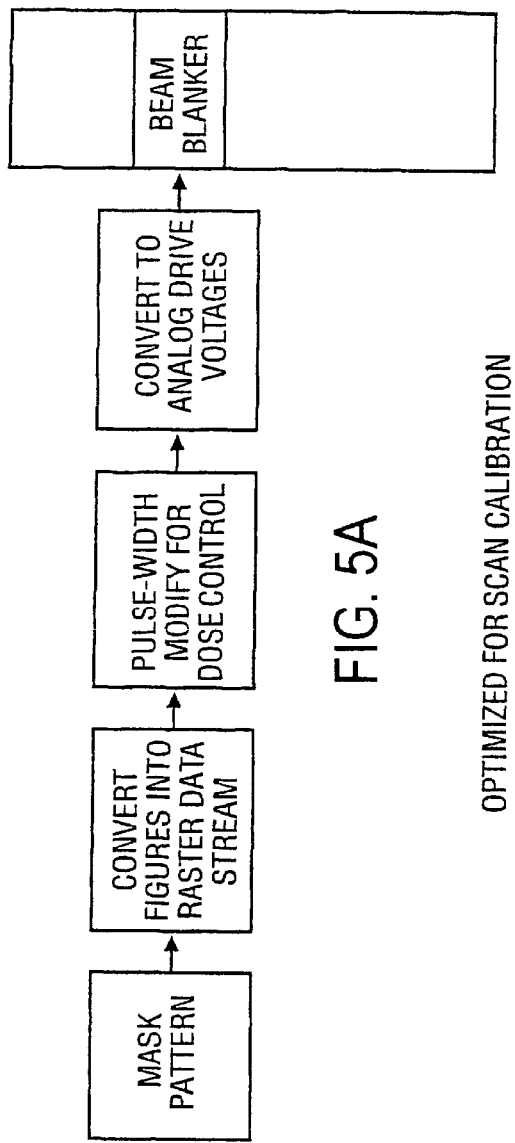
FIG. 5: Schematic block diagram of typical data path (A) and data path optimized for scanning calibration (B).
Figure 5B:
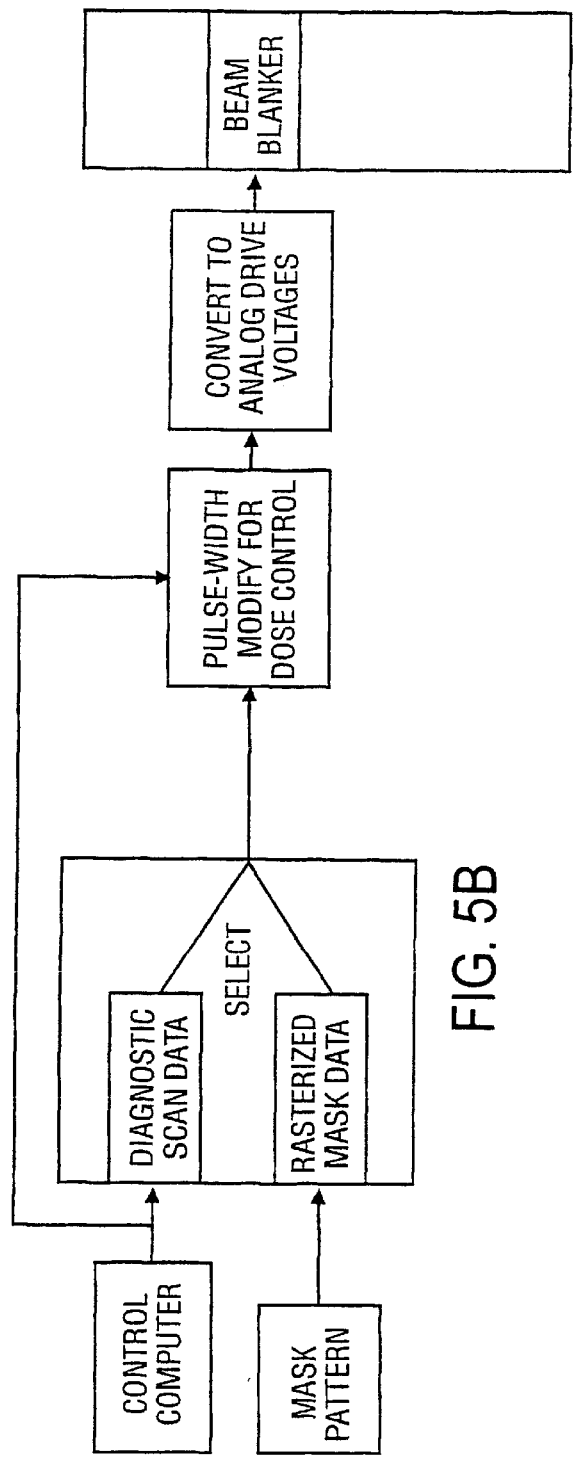

One approach to enhancing patterning accuracy in uni-directional scanning is to determine scanning inaccuracies (typically in a preliminary calibration procedure) then apply appropriate corrections in real time as the patterning is being performed. The '085 patent to the present inventor is an example of this approach. The calibration procedures and computation of beam correction factors are typically independent of the user-supplied pattern data. However, it is typical that the use of a full data preparation sub-system must be employed to process even the simplest of pixel exposures. The present invention provides advantages in comparison with these prior techniques in two general ways. Firstly, the present invention isolates a section of the data path hardware specifically to provide calibration scans. Although this improvement may be employed for uni-directional as well as bi-directional scans, it is particularly advantageous for use with bi-directional scanning as the number of required calibration calculations has increased due chiefly to the doubling of the number of independent scan directions from 1 to 2. The typical data path and the data path optimized for effective scanning calibration (uni- and bi-directional) is depicted schematically in FIGS. 5A and 5B.

Figure 6A:
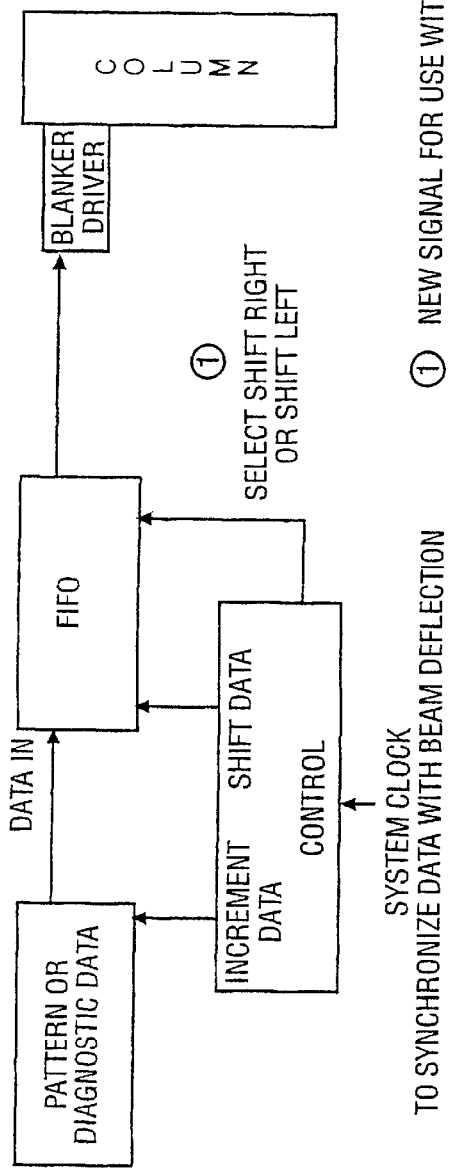
FIG. 6: 6A depicts schematic block diagram of optimized data path for bi-directional scanning and 6B depicts bi-directional scanning waveforms.
Figure 6B:
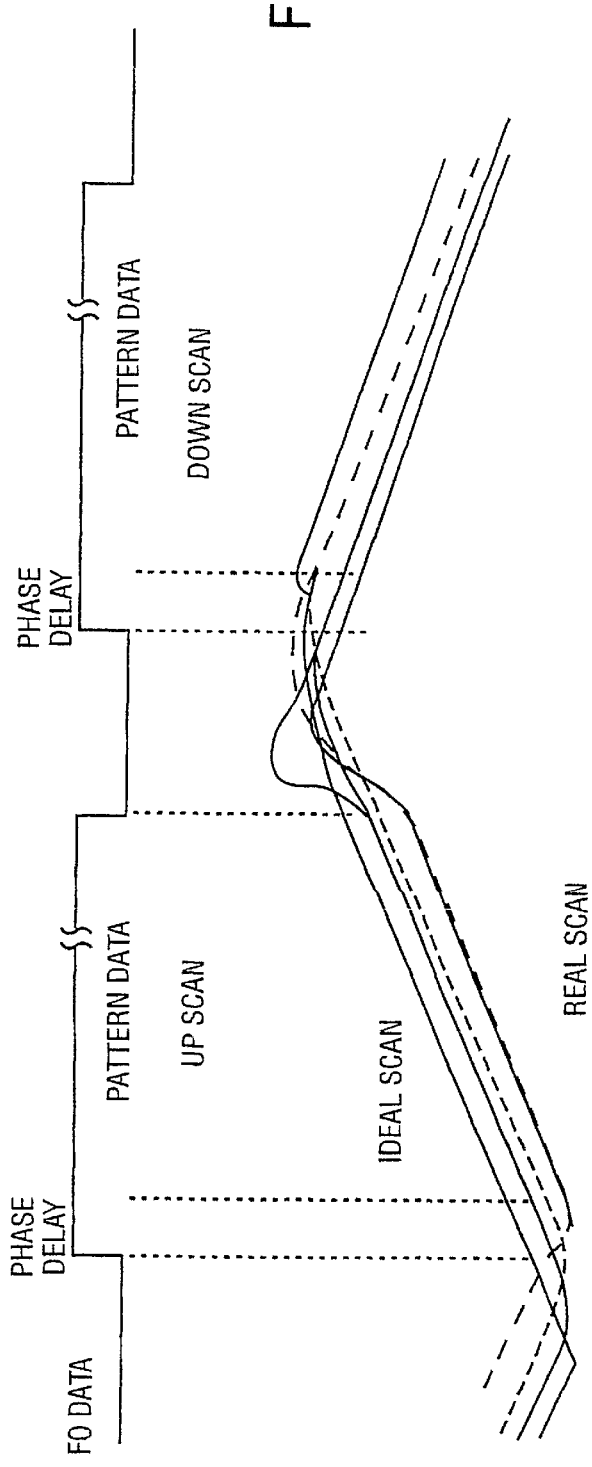

The second improvement relates to the characteristic of the present invention optimizing the data path hardware for bi-directional scanning. An example is depicted in FIG. 6A and 6B illustrating the use of first-in-first-out ("FIFO") registers in the data preparation hardware. The purpose of the data preparation hardware is to provide output data in the proper order to generate scan signals in the proper active direction. That is, the sawtooth waveform for uni-directional scanning depicted in FIG. 4 is to be replaced with a triangular waveform for bi-directional scanning depicted in FIG. 6B. The FIFO register receives a signal from a timing circuit that tells the system the direction of the e-beam scan, upwards or downwards in FIG. 2. In addition to the data direction output, a phase control or data delay circuit is built into the function that can shift the timing of the entire scan data by times corresponding to the scanning of multiple pixels (typically up to several hundred). The finite bandwidth of the analogue drivers cause such delays that may be exceed 200 pixels. These delays may be corrected by either analogue or digital methods. The delay circuit built into the data preparation hardware helps compensate for such delays in the analogue signals generating the up and down scans. A phase delay circuit in the FIFO register is one way of controlling this delay.

Figure 7A:
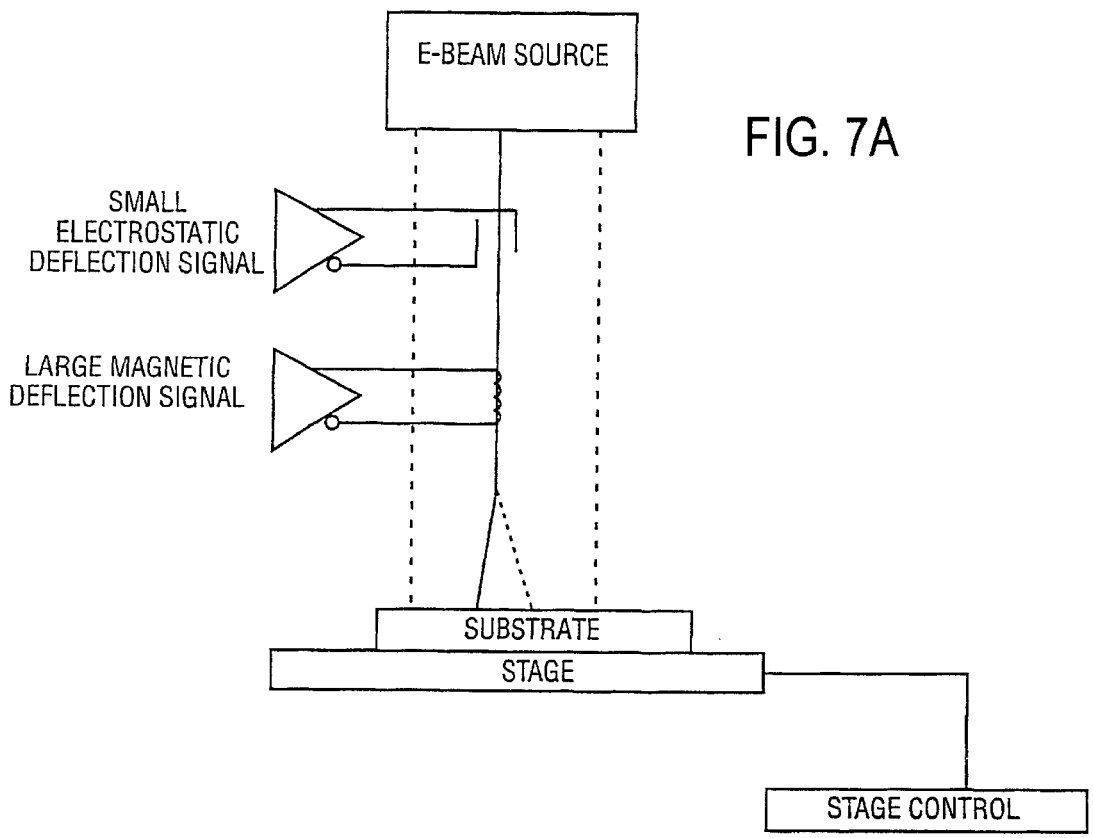
FIG. 7: Schematic depiction of beam control elements (A), and staircase signal generation (B).
Figure 7B:
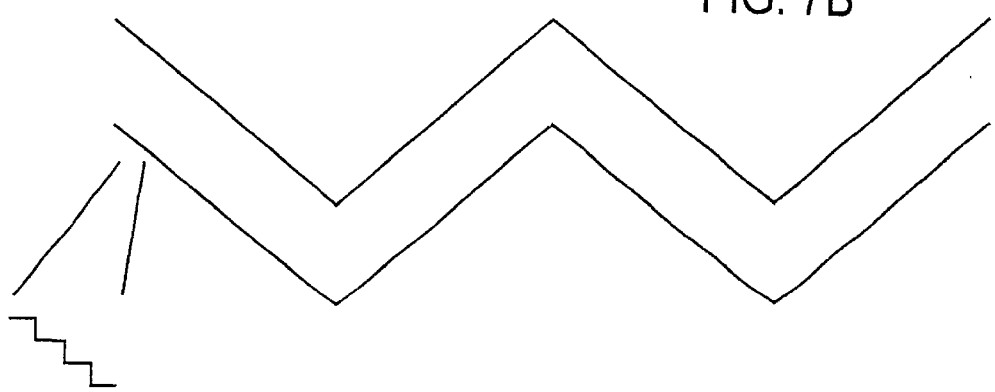
Figure 9:
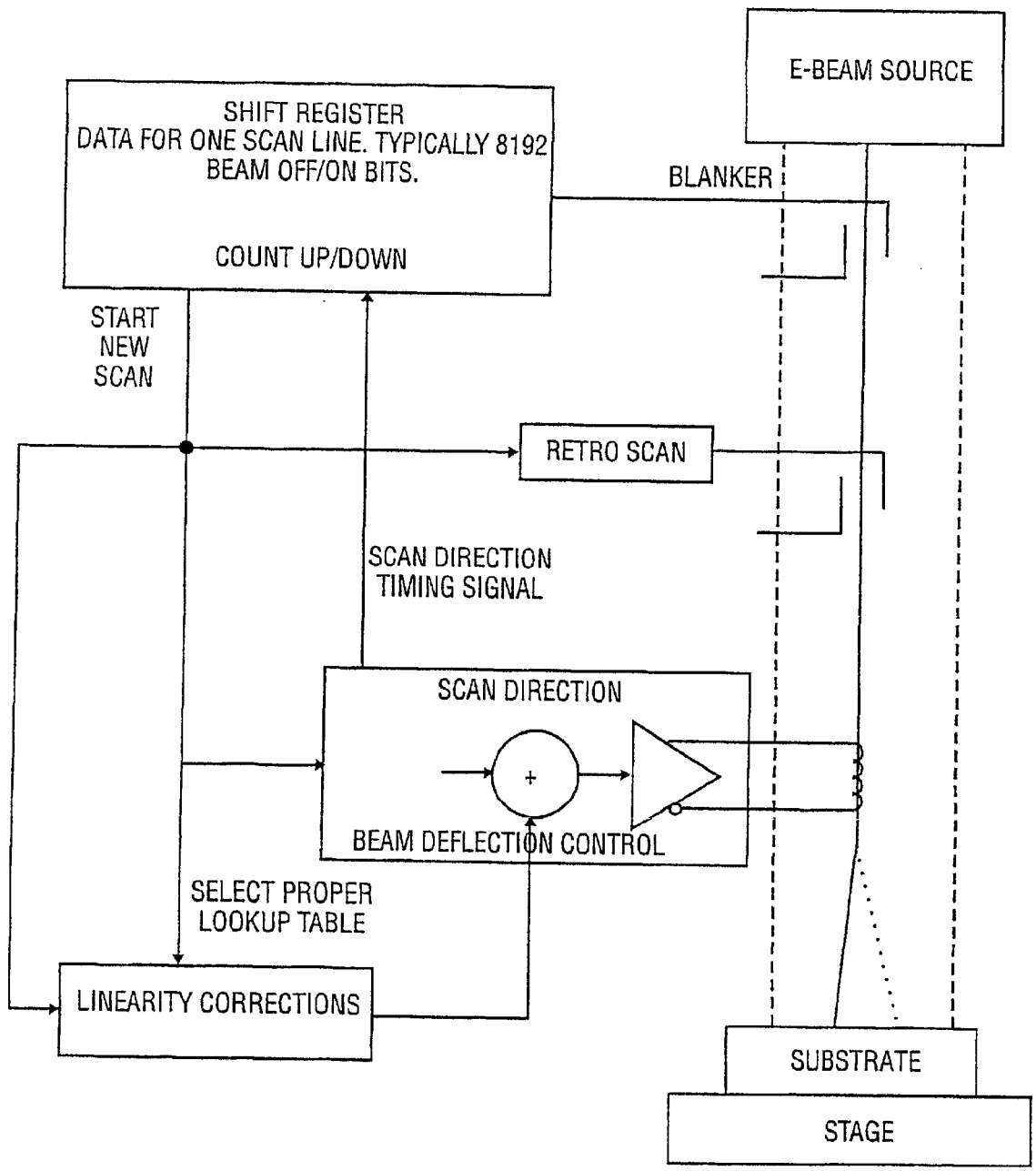
FIG. 9: Schematic block diagram of bi-directional scan timing circuit.

An ideal e-beam lithography system would have the beam remain stationary at the location of a given pixel for a length of time to deliver the proper dose of energy to such pixel, then jump with no time delay to the location of the next pixel. One goal of the present invention is to achieve a workable approximation to this ideal case. A two level deflection system depicted in FIG. 7 is one way to achieve such a workable approximation to the ideal. The electrostatic deflector provides a low voltage, high speed sawtooth signal. This high speed signal is superimposed on the slow speed magnetic deflection signal to move the e-beam in a staircase fashion depicted in FIG. 7B and the timing circuitry is depicted in FIG. 9. The bi-directional implementation of this scheme as described herein provides for controlling the polarity of the retroscan signal to match the polarity of the main magnetic deflection signal. By providing additional control of the phase of the retroscan signal one is able thereby to match the operation of the retroscan signal with the beam blanking signal.

Figure 8A:
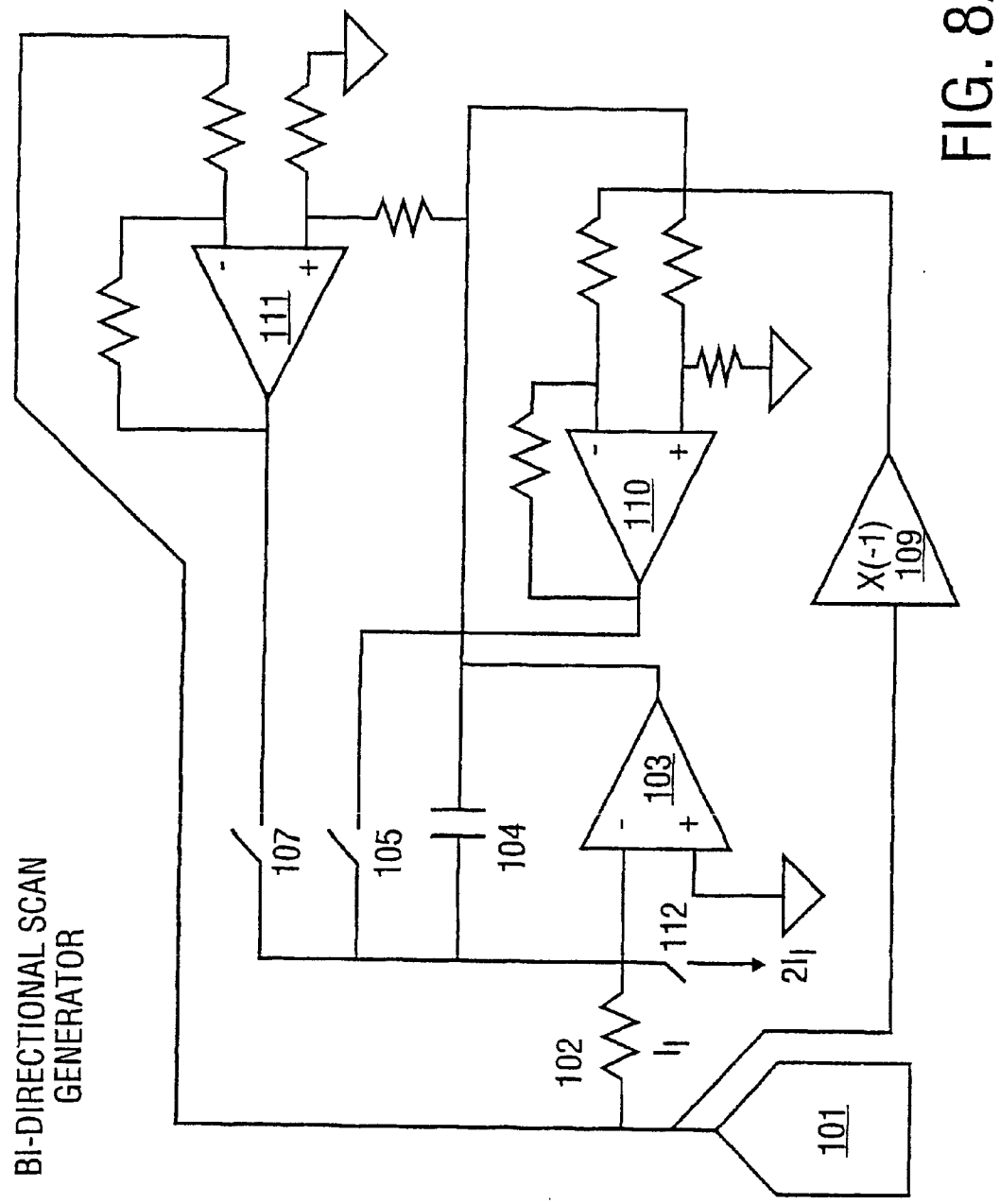
FIG. 8A: Schematic block diagrams of bi-directional scan generator.
Figure 8B:
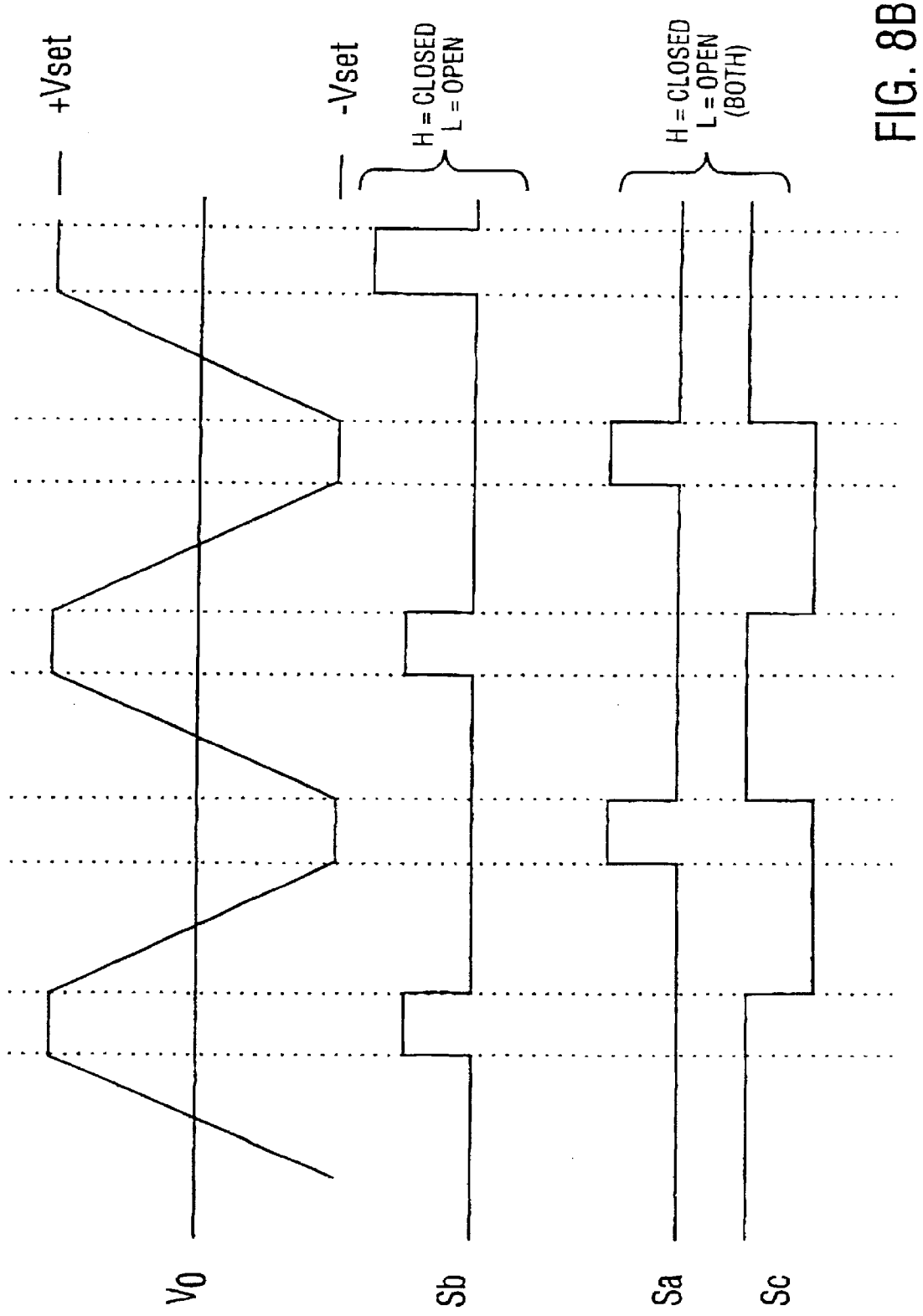
FIG. 8B: Typical waveforms generated by circuit.

A bi-directional scan signal generator pursuant to an embodiment of the present invention is depicted in FIG. 8A, and waveforms generated by the equivalent circuit in FIG. 8B. This bi-directional scan signal generator provides the capability to control both the signal amplitude and phase of the triangular signal to a high level of accuracy. One characteristic of e-beam lithography systems helpful in achieving these goals is the permissible "turn-around" time of the e-beam scan. Practical e-beam lithography systems allow for (and deem acceptable) a certain amount of turn-around time, or an interval following the scanning of a line for the beam to be repositioned and aligned to begin scanning the next line. Typically, the e-beam is blanked (or otherwise not impinging on the target) during turn-around time. The typical operation of this embodiment of the present invention depicted in FIG. 8A is described below. Digital-to-Analogue Converter ("DAC"), 101 supplies a voltage that is used ultimately to determine the overall length of the e-beam scan. Typically, this voltage would be approximately 10 volts (and generate a scan line of 1000 $\mu$m), although different voltages are readily employed to generate scan lines having different lengths. This voltage is applied to resistor 102, establishing an integrating current which is applied to amplifier 103 and feedback capacitor 104. Application of a constant current forces the output of amplifier 103 to ramp down in a substantially linear manner until analogue switch 105 closes. Preferably, amplifier 110 is a differential amplifier with a gain of 1 with which inverting amplifier 109 (nominally at −10 volts) has an output of zero volts when the output of amplifier 103 is −10 volts. The closing of switch 105 forces amplifier 103 into a different closed feedback loop that maintains the output of amplifier 103 at the nominal end-of-ramp voltage of typically −10 volts. At this point, switch 105 opens and switch 112 closes, forcing the integrating amplifier, 103, to ramp up until the timing circuit (FIG. 9) closes switch 107, forcing the output voltage of 103 (through the closed loop path of difference amplifier 111) to be a nominal +10 volts. Although slight voltage drift may have occurred during ramp-up, the output voltage is always set to a + or − value of the input DAC (101) voltage. This circuitry allows both the peak-to-peak voltage as well as the timing to be stable (typically, the timing is set by system timing circuits, not depicted herein).

Another feature of this invention relates to methods and circuits for controlling the timing that synchronizes important functions of the beam deflection and beam control modules. One important objective of the present invention is the provide accurate synchronization of deflection, control and other signals to achieve accurate placement of e-beam pixels. Achieving low signal "jitter" is a concern of the present invention. Improper selection and routing of timing signals can lead to harmful levels of noise and unacceptable e-beam misplacements. An adequate timing scheme must also allow for a variety of analogue phase delays that may vary as various scan lengths or scan directions are used. The present makes use of a series of coarse and fine timing delay adjustments to accommodate a variety of operating conditions and uses timing control signals that enhance the operation of e-beam bi-directional scanning. An embodiment of the timing circuit according to the present invention is depicted in block form in FIG. 9.

The goals achieved by the circuit whose waveforms are depicted in FIG. 8B are two fold: precise amplitude control and precise timing in coordination with system timing. The amplitude is controlled by means of the voltage $V_{set}$. System timing signal, for example $S_b$, normally closes, when $V_O$ is near $+V_{set}$. When this occurs, the feedback voltage, $+V_{set}$, forces the output to remain stationary at $+V_{set}$. The output remains at that voltage until $S_c$ opens and also $S_b$ opens. The output voltage is then forced via input current $(V_{set})/(R_{int})$, to ramp in the negative direction. It does so until $S_a$ closes and forces $V_O$ to be $-V_{set}$.

Timing of the ramp signals, $S_a$, $S_b$, $S_C$ are precisely controlled by system clocks, typically to 1 ppm timing precision. Thus the ramp does not change direction (remaining at $+V_{set}$ or $-V_{set}$) until allowed to do so by system timing. Timing, therefore, is not a function of the individual components as shown in FIG. 3A but rather depends on the overall system synchronization and timing.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A bi-directional scan signal generator for a beam lithography system comprising a digital-to-analogue converter supplying a voltage of approximately 10 volts to a resistor, establishing thereby an integrating current applied to a first amplifier and a first feedback capacitor thereby forcing the output of said first amplifier to ramp down in a substantially linear manner resulting in closure of a first analogue switch forcing said first amplifier into a closed feedback loop that maintains the output of said first amplifier at the nominal end-of-ramp voltage, causing said first analogue switch to open and a second analogue switch to close, forcing said amplifier to ramp up until a timing circuit closes a second analogue switch forcing the output voltage of said first amplifier to be nominal +10 volts.

2. A data processing system controlling a bi-directional beam lithography apparatus comprising data path hardware including an isolated section of the hardware for providing bi-directional calibration scans.

3. A data processing system controlling a bi-directional beam lithography apparatus comprising a first-in-first-out-register receiving a signal from a timing circuit corresponding to the direction of beam scan, said register further comprising a phase delay circuit having a configuration to shift the timing data of the entire scan line.

4. A beam deflecting system comprising:
a) a first deflector comprising a low voltage, high speed electrostatic deflector configured to deflect said beam in a first direction of a bi-directional scan; wherein said first deflector receives scan line control information and linearity corrections from a shift register and,
b) a second deflector comprising a low voltage, high speed electrostatic deflector configured to deflect said beam in the second, retro direction in said bi-directional scan; wherein said second deflector receives scan line control information and linearity corrections from said shift register and,
c) a third deflector comprising a slow speed magnetic deflector configured to deflect said beam in a staircase manner when the beam deflection caused by said third deflector is superimposed with the deflection caused by said first and said second deflectors.

5. A beam deflecting system as in claim 4 further comprising a controller having the configuration for controlling the polarity of the retro scan signal to match the polarity of the magnetic deflection signal.

* * * * *